United States Patent [19]

Hwang et al.

[11] Patent Number: 5,785,825
[45] Date of Patent: Jul. 28, 1998

[54] MULTI-PHASE OVERCOATS FOR MAGNETIC DISCS

[75] Inventors: Kuo-Hsing Hwang, San Jose; Xiaohua Chen, Fremont; Alexander Boris Khazanov, Mountain View; Abdellah Hafid, Campbell; Stella Tan, San Jose; Quy Cuu Nguyen, Milbidas, all of Calif.

[73] Assignee: Seagate Technology, Inc., Scotts Valley, Calif.

[21] Appl. No.: 538,124

[22] Filed: Oct. 2, 1995

[51] Int. Cl.[6] ............................................. C23C 14/34
[52] U.S. Cl. ........................ 204/192.16; 204/192.15; 204/192.2; 427/131
[58] Field of Search ................... 204/192.15, 192.16, 204/192.2; 427/131

[56] References Cited

U.S. PATENT DOCUMENTS

| | | | |
|---|---|---|---|
| 4,724,169 | 2/1988 | Keem et al. | 204/192.16 |
| 4,778,582 | 10/1988 | Howard | 204/192.2 |
| 4,820,584 | 4/1989 | Morita et al. | 204/192.2 |
| 5,045,165 | 9/1991 | Yamashita | 204/192.15 |
| 5,453,168 | 9/1995 | Nelson et al. | 427/131 |

OTHER PUBLICATIONS

Marinkovic et al., "Preparation and Properties of Sputtered Glassy Carbon Films", Carbon, vol. 14, No. 6, pp. 329–331, Pergamon Press, 1976.

"'Dual–Carbon', A New Surface Protective Film For Thin Film Head Disks", by J. Ishikawa, N. Tani, T. Yamada, Y. Ota, K. Nakamura and A. Itoh, *IEEE Transactions On Magnetics*, vol. Mag.–22, No. 5, Sep. 1986.

"Thin Film Processes", by John L. Vossen, Wener Kern, *Academic Press, Inc.*, 1978, pp. 131–137.

*Primary Examiner*—R. Bruce Breneman
*Assistant Examiner*—Rodney G. McDonald
*Attorney, Agent, or Firm*—Westman, Champlin, & Kelly, P.A.

[57] ABSTRACT

A magnetic disc for use in a magnetic disc drive is provided. The magnetic disc includes a recording surface wherein the recording surface includes a dual phase carbon overcoat. The dual phase carbon overcoat includes an amorphous carbon film sputtered on a magnetic layer. A doped amorphous carbon film is sputtered on the amorphous carbon film. The dual phase carbon overcoat has demonstrated improved hardness, reduced stiction and superior corrosion resistance over the prior art. A method of manufacturing the magnetic disc is also provided. The method includes providing a sputtering apparatus having a process chamber, providing a partially manufactured magnetic disc having a magnetic layer thereon, placing the partially manufactured magnetic disc within the process chamber, sputtering an amorphous carbon film on the magnetic layer, and sputtering a doped amorphous carbon film on the amorphous carbon film. The process reduces throughput inefficiencies due to down time cleaning and avoids carbon induced damage to the discs.

17 Claims, 10 Drawing Sheets

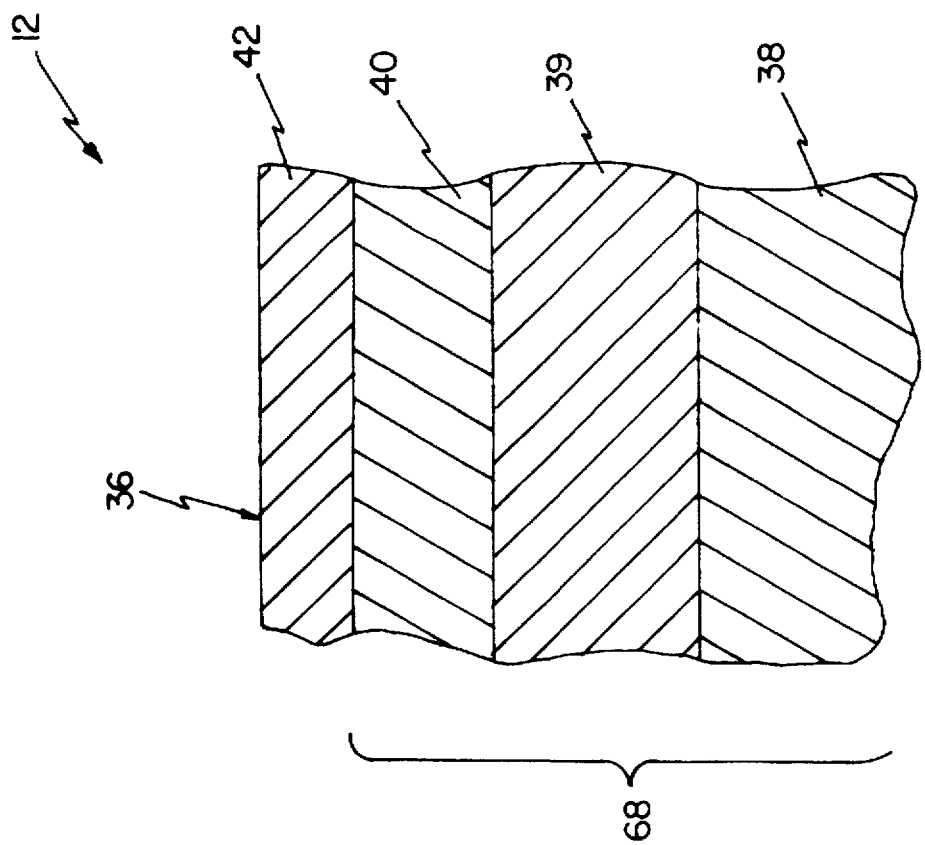

MULTI-PHASE OVERCOATS FOR MAGNETIC DISCS

BACKGROUND OF THE INVENTION

The present invention relates to recording surfaces of magnetic disc drives. More specifically, the present invention relates to overcoats on recording surfaces of magnetic discs for use in magnetic disc drives and processes for making the same.

Computer systems, or the like, often times employ magnetic disc drives to store information such as computer programs or data. Magnetic disc drives typically include a transducing head mounted on a slider which "flies" over the surface of a rotating rigid magnetic disc. The transducing head is positioned over a selected portion of the disc by an electronic circuitry controlled actuator. The transducing head is used to generate magnetic fields which are impressed onto the surface of the disc during writing of information, and to sense magnetic fields from the disc surface during readback of information.

The disc includes a magnetic layer deposited on a rigid substrate. The magnetic layer is suitable for storing magnetically encoded information. When the disc drive is powered down, the transducing head rests on the surface of the disc. During operation of the disc drive, the transducing head typically is spaced apart from the surface of the disc by a layer of air under the slider which is created by the rotating disc. The surface of the disc "pulls" air under the slider which lifts the slider off the surface of the disc. Although the slider is lifted from the surface of the disc, it is known that improved magnetic interaction between the transducing head and the disc can be achieved by reducing the spacing between the transducing head and the disc surface. Therefore, the transducing head generally flies proximate the disc surface such that limited, intermittent contact occurs between the slider and disc surface, which causes wear of the disc surface. Wear causes a degradation of the disc which adversely affects its ability to store information thereon. Additionally, the disc is susceptible to corrosion which also provides detrimental effects.

In order to protect the disc from wear and corrosion, overcoats are usually deposited thereon. A suitable overcoat must not only resist wear and corrosion, but also maintain proper hydrodynamic effects of the disc surface, as measured by "stiction" and "friction", such that the slider and transducing head may efficiently interact with the rotating disc.

Overcoats are deposited as a film on the magnetic surface, which permits proper interaction between the magnetic surface and the transducing head. Such film overcoats are typically applied to the magnetic layer by a process known in the art as "sputtering". Simply put, sputtering requires the rigid disc having the magnetic layer to be placed in a process chamber proximate a negatively charged "target", such as carbon, which will eventually comprise the overcoat. An argon gas is provided to the process chamber. A high voltage is applied to the gas such that it becomes a plasma including positive charged ions, electrons and neutral argon atoms. The positive charged ions of the plasma bombard the target. The resulting substance is deposited on the disc, which is electrically grounded, as a thin film. In this example, such a thin film is known as amorphous carbon (a-C).

Amorphous carbon films were once popular overcoats in the magnetic recording medium industry. Amorphous carbon films provide a very hard surface which resists mechanical wear. However, amorphous carbon films severely suffer from a condition known as "tribochemical" wear, which is undesirable. The disadvantages of amorphous carbon films have caused it to fall out of favor in the industry.

Amorphous carbon films have largely been replaced with doped amorphous carbon films, for example hydrogenated amorphous carbon (a-C:H) or nitrogenated amorphous carbon (a-C:N), as overcoats. Hydrogenated amorphous carbon, for example, is hydrogen doped amorphous carbon. It can be produced by the sputtering process described above wherein the argon gas is mixed with a certain amount of hydrogen. As such, doped amorphous carbon film is produced by a process also called "reactive sputtering". Similarly, nitrogenated amorphous carbon is nitrogen doped amorphous carbon. It can be produced by reactive sputtering wherein the argon gas is mixed with a certain amount of nitrogen. Doped amorphous carbon is characterized by high electrical resistivity.

Although the doped amorphous carbon film is not as hard as amorphous carbon film, doped amorphous carbon film has a significantly higher resistance to tribochemical wear than amorphous carbon film. As such, it has been proven that the overall performance of doped amorphous carbon film is far superior to amorphous carbon film, and thus doped amorphous carbon film is currently very popular with the magnetic storage medium industry.

Doped amorphous carbon films, however, are not without disadvantages. A common problem with sputtering of doped amorphous carbon film is arcing (or sparks) from the carbon target which can cause damage to the disc. Such damage is commonly called carbon induced damage (CID). CID is undesirable because it can adversely affect the information storing properties of the disc.

Arcing is believed to originate from the development of positive charge at some local irregularities or foreign particles on the carbon target. When hydrogen/argon gas, for example, is introduced at the target, a polymer film comprising carbon and hydrogen can form on the target. The polymer film is an insulator, and therefore forms "insulating sites". The electric charge at the insulating sites cannot dissipate quickly enough and a positive charge accumulates at the insulating sites.

Because the target is under a negative potential during sputtering, a voltage is developed between the target and the positively charged insulating sites. When the voltage becomes sufficiently high, a dielectric breakdown can occur which causes large electric current density in the local area. In other words, local arcing occurs. Additionally, the high current density causes a very intense temperature rise, which can transform the carbon target proximate the insulating sites into a glassy carbon. The glassy carbon sites are undesirable and provide a suitable region for the deposition of backsputtered species. The glassy carbon sites become "nodules". Often times the top layer of the nodule is electrically resistive and a positive charge is developed. A voltage is developed between the positive charge and negatively charged carbon target which serves to prevent the surrounding area from being sputtered. When a sufficiently high voltage is developed, dielectric breakdown occurs. The dielectric breakdown serves to spill nodule pieces in the chamber. Some of the spilled nodule pieces hit the disc and cause CID.

It has been determined that the frequency of the arcing is related to the resistivity of the overcoat film. Hydrogenated amorphous carbon, for example, is much more resistive than amorphous carbon. Thus, arcing occurs much more frequently, and the problem of CID is much more severe with hydrogenated amorphous carbon, and also with nitrogenated amorphous carbon, than with amorphous carbon.

In order to address the problem of arcing associated with the use of doped amorphous carbon, the prior art employs a system which periodically cleans the targets of nodules and insulating sites. During cleaning, argon gas, rather than the mixture of argon and hydrogen gas, for example, is used to bombard the target to break up the nodules and insulating sites. The resulting amorphous carbon is quite conductive, which helps dissipate the charge accumulated on the nodules. During cleaning, the resulting amorphous carbon and residuals are exhausted from the chamber.

FIG. 1 shows the frequency of CID as a function of sputtering time using a hydrogen/argon gas mixture. CID frequency is dramatically decreased after argon cleaning, shown at P100. Thereafter, CID frequency increases with time to almost 40 percent after 20 hours of sputtering time, P102. Thus, in order to avoid CID's, the target must be cleaned quite frequently.

Unfortunately, cleaning the target occurs during down time, which, as described above, must occur quite frequently to avoid CID's. Also, the cleaning process typically requires about an hour of down time to effectively remove the nodules and insulating sites. Thus, each day, manufacturing time must be interrupted in order to effectively clean the target. Such interruptions significantly reduce throughput and manufacturing efficiency. Thus, there exists a need for an overcoat film which can effectively protect the magnetic layer of a disc and which can be deposited thereon by a process that can easily be implemented and does not produce significant manufacturing inefficiencies.

SUMMARY OF THE INVENTION

The present invention provides for a magnetic disc for use in a magnetic disc drive, the magnetic disc having a recording surface wherein the recording surface includes a dual phase carbon overcoat. The dual phase carbon overcoat includes an amorphous carbon film sputtered on a magnetic layer. A doped amorphous carbon film is sputtered on the amorphous carbon film. The dual phase carbon overcoat of the present invention has demonstrated improved hardness, reduced stiction and superior corrosion resistance over the prior art.

A method of manufacturing the magnetic disc includes providing a sputtering apparatus having a process chamber, providing a partially manufactured magnetic disc having a magnetic layer thereon, placing the partially manufactured magnetic disc within the process chamber, sputtering amorphous carbon film on the magnetic layer, and sputtering doped amorphous carbon film on the amorphous carbon film. The process of the present invention reduces throughput inefficiencies due to down time cleaning and avoids carbon induced damage to the discs.

BRIEF DESCRIPTION OF THE DRAWINGS

FIG. 3A is a more detailed view of a portion of FIG. 3.

DETAILED DESCRIPTION OF THE PREFERRED EMBODIMENTS

Figure 2:
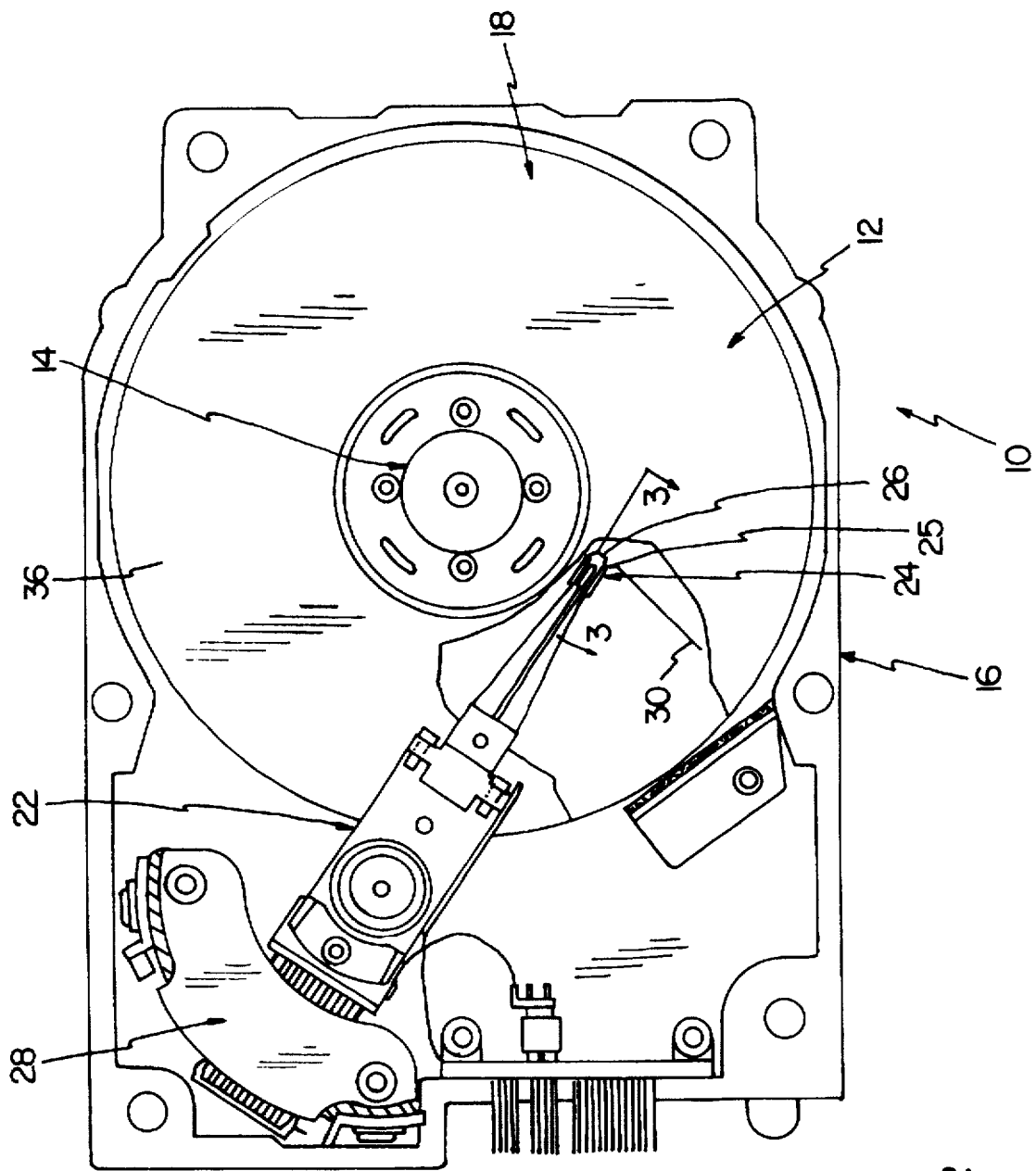
FIG. 2 is a top view of a disc drive with its upper casing removed and embodying features of the present invention.

Referring to FIG. 2, a rotary magnetic disc drive system suitable for incorporating the teachings of the present invention is shown in diagrammatic form and is referred to generally at 10. A plurality of magnetic information storage discs 12 are journaled about a spindle motor assembly 14 within a housing 16. Each magnetic disc 12 has a multiplicity of concentric circular recording tracks, indicated schematically at 18, for recording information. An actuator arm assembly 22 is rotatably mounted preferably in one corner of the housing 16. The actuator arm assembly 22 carries a plurality of head gimbal assemblies 24 that each carry a slider 25 having a read/write head 26 for reading information from and writing information onto the magnetic discs 12. A voice coil motor 28 is adapted to precisely rotate the actuator arm assembly 22 back and forth such that the recording heads 26 move across the magnetic discs 12 along arc 30. The discs 12 include a recording surface 36 which is generally textured.

Figure 3:
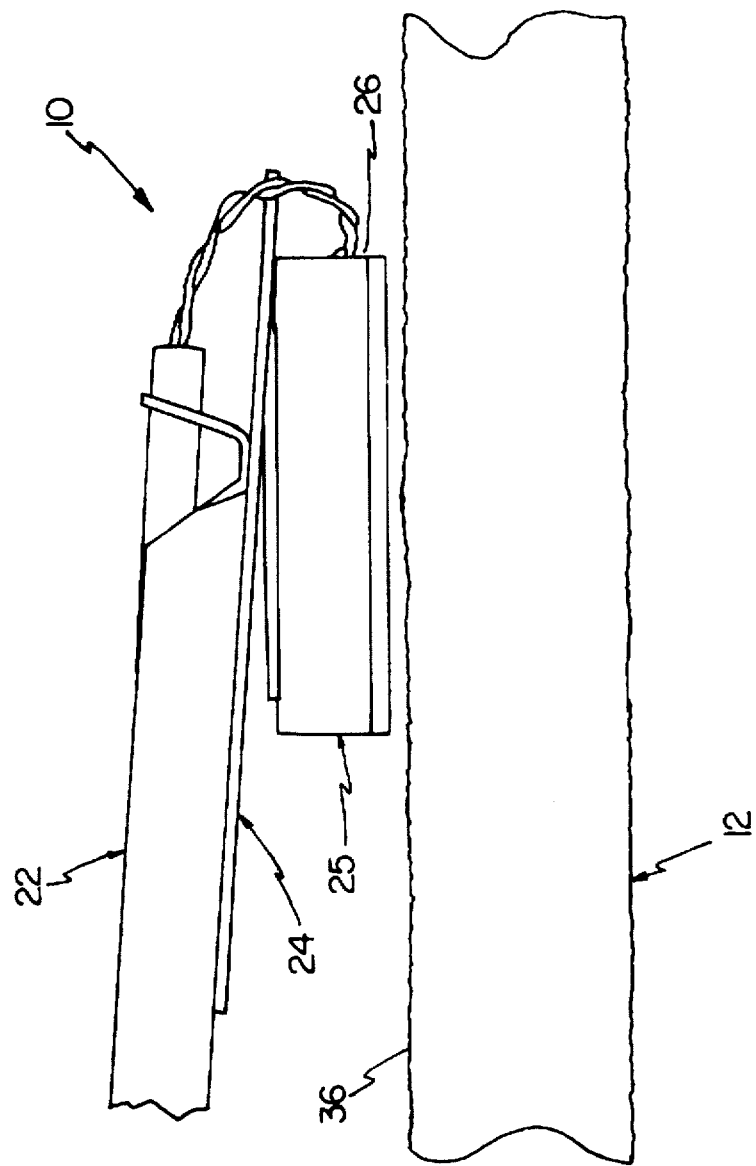
FIG. 3 is a schematic cross-section view of a portion of FIG. 2 taken along lines 3—3.

FIG. 3 is a schematic cross-section view of a portion of the disc drive system 10 of FIG. 2 taken along lines 3—3. The head gimbal assembly 24 resiliently supports the slider 25 over the disc 12. As the disc 12 rotates, the textured recording surface 36 drags air underneath the slider 25 which allows the slider 25 to "fly" over the surface of the disc. The head gimbal assembly 24 allows the slider 25 to pitch and roll while the head gimbal assembly 24 follows the topography of the disc 12. The transducing head 26 may occasionally contact the recording surface 36, in a limited and intermittent fashion. This contact between the slider 25, recording head 26 and recording surface 36 causes wear on the respective parts of the drive 10. This wear can adversely effect the recording surface 36.

FIG. 3A is a more-detailed cross-section view of a portion of the disc 12. The magnetic disc is typically fabricated from a substrate 38 made from Al/NiP. The substrate 38 preferably includes a layer of chromium (Cr) 39 sputtered thereon. Layer 39 is employed to enhance the magnetic coercivity of the recording surface 36, and is typically about 1500 angstroms thick. Thereafter, a magnetic layer 40 is sputtered on layer 39. The magnetic layer 40 preferably consists of a cobalt/chromium/tantalum alloy. The magnetic layer 40 is covered with a dual phase overcoat, indicated generally at 42. The dual phase carbon overcoat includes at least one layer of amorphous carbon film and doped amorphous carbon film, as described in detail below.

Figure 4:
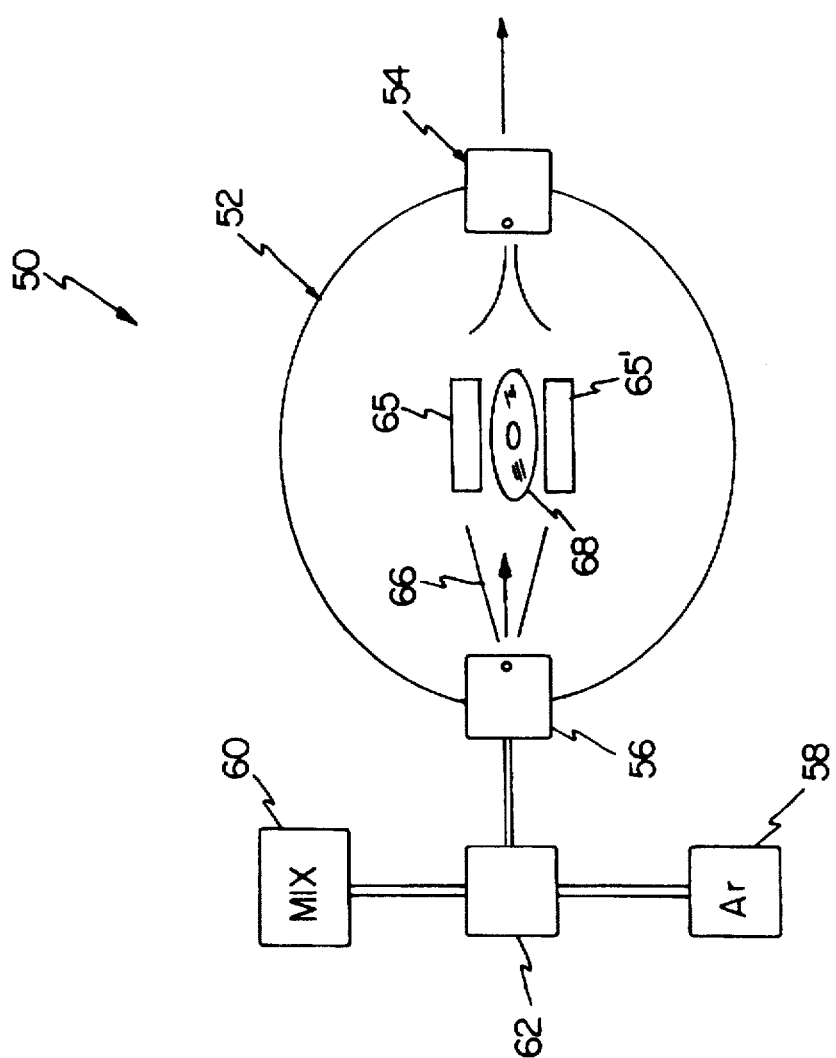
FIG. 4 is a schematic diagram of an apparatus for effecting a process embodying features of the present invention.

FIG. 4 shows a schematic view of an apparatus 50 for use in depositing the dual phase overcoat layer 42. Apparatus 50 is a single carbon process chamber system, and is known in the art. Apparatus 50 incudes a process chamber 52, exhaust pump 54 and gas outlet 56. Gas outlet 56 is connected to a source of argon gas 58, a source of gas including an argon mixture 60 (such as a mixture of argon and hydrogen, argon and nitrogen, or the like), and a control means 62. In one embodiment, mixture 60 includes about 92 percent argon and about 8 percent hydrogen. Control means 62 is used to select whether argon gas 58, or the argon mixture 60 is sent through outlet 56 and into the process chamber 52. Carbon targets 65 and 65' are positioned within the process chamber 52 and within a flow of gas 66 emanating from outlet 56. The gas 66 becomes a plasma when subjected to a high voltage within the chamber 52. Thus, the ions of the plasma bombard the carbon target 65. A disc consisting of substrate 38, chromium layer 39, and magnetic layer 40 suitable for deposition of an overcoat layer thereon is indicated generally at 68, and positioned within process chamber 52 proximate the target 65. The targets 65 and 65' are negatively charged and bombarded with positively charged ions. The plasma becomes "excited" between the targets 65, 65' and disc 68, and the resulting substance is deposited on the disc 68, which is electrically grounded, as a thin film. Two targets 65 and 65' are used to deposit film on both sides of the disc 68 at once. Excess substance is exhausted through exhaust pump 54.

Figure 5:
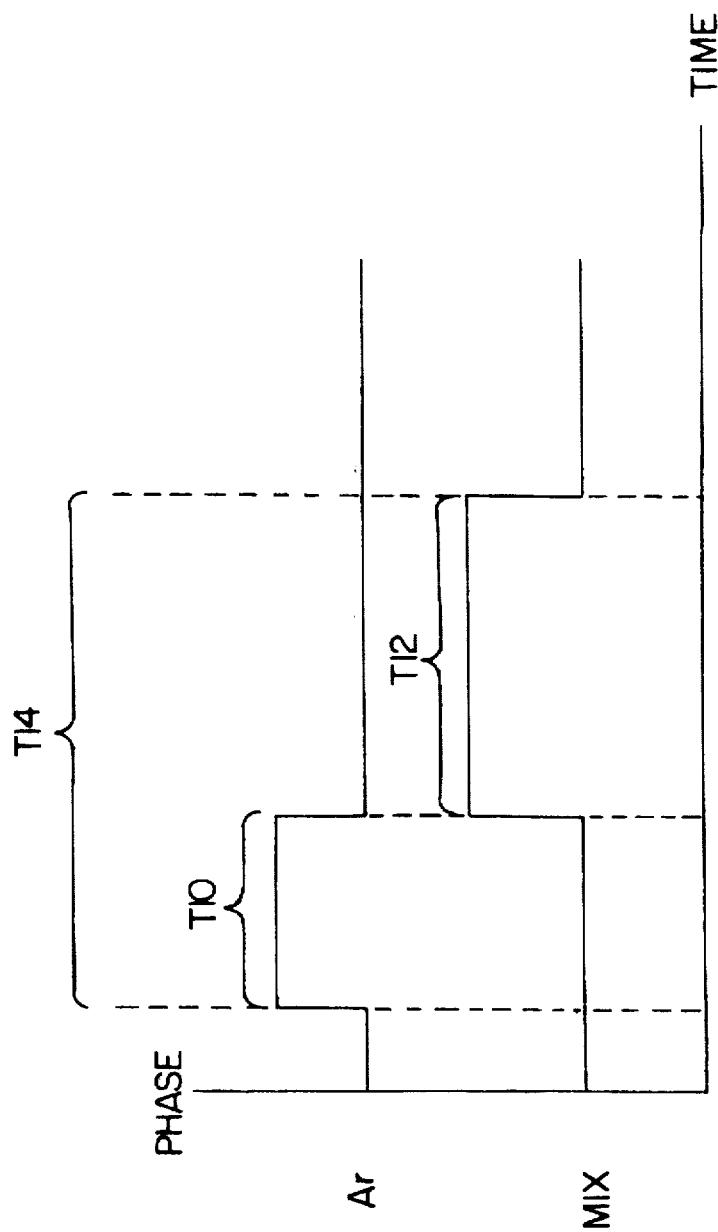
FIG. 5 is a timing diagram of an operational example of the present invention.

FIG. 5 shows a diagram of the carbon process timing of the ions used to bombard the carbon targets 65 and 65'. For each disc 68 placed within the process chamber 52, the carbon targets are bombarded first with argon ions exclusively for a period of time, or during an "argon phase" indicated at T10 to create an amorphous carbon film, and then exclusively by the argon mixture of ions for a period of time, or during a "reactive argon phase" indicated at T12 to create a doped amorphous carbon film which together with the amorphous carbon film provides overcoat 42. In one embodiment, the time for the argon phase T10 is about 10 seconds, and the time for the reactive argon phase T12 is about 13 seconds such that disc 68 is subjected to dual phase overcoat sputtering T14 for approximately 23 seconds. The doped amorphous carbon film can include hydrogenated amorphous carbon, nitrogenated amorphous carbon, or the like.

Figure 6:
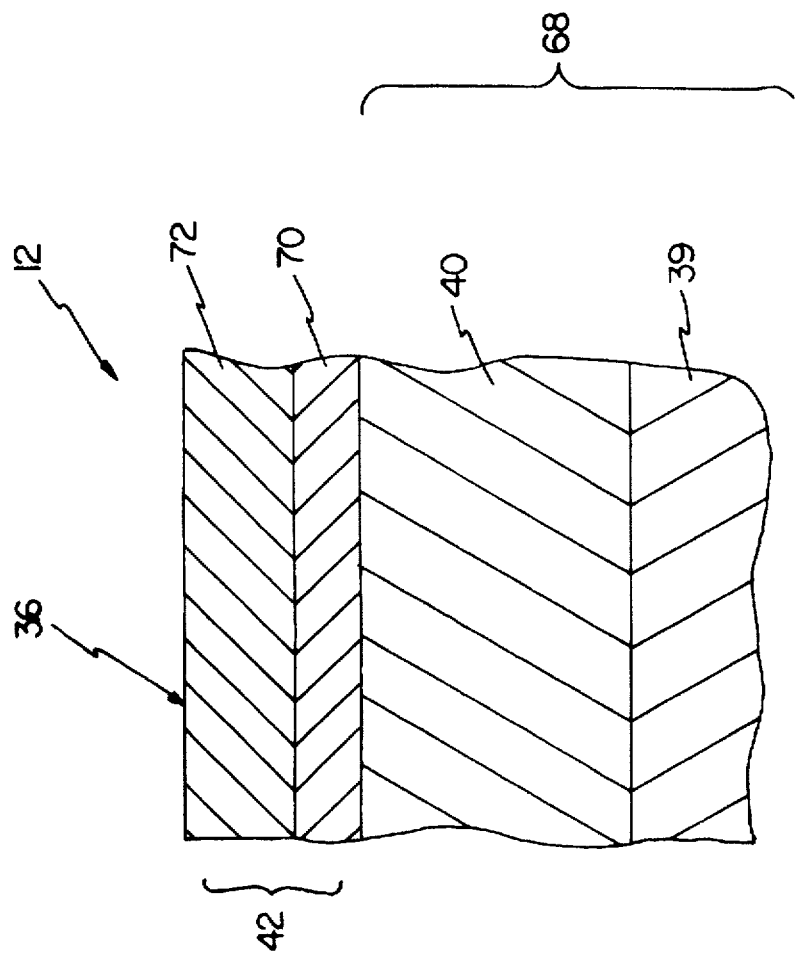
FIG. 6 is a schematic cross-sectional view of a magnetic disc of the disc drive of FIG. 2 and embodying features of the present invention.

FIG. 6 shows a cross-section of disc 12 having dual phase overcoat 42 deposited thereon. Dual phase overcoat 42 comprises an amorphous carbon film 70 deposited on magnetic layer 40, and doped amorphous carbon film 72 deposited on film 70. The amorphous carbon film 70, created by the dual phase process depicted in FIG. 5 and during the argon phase T10, is approximately 55 angstroms thick. The doped amorphous carbon film 72 created by the dual phase process and during the reactive argon phase is approximately 145 angstroms thick such that the overcoat is approximately 200 angstroms thick.

Figure 1:
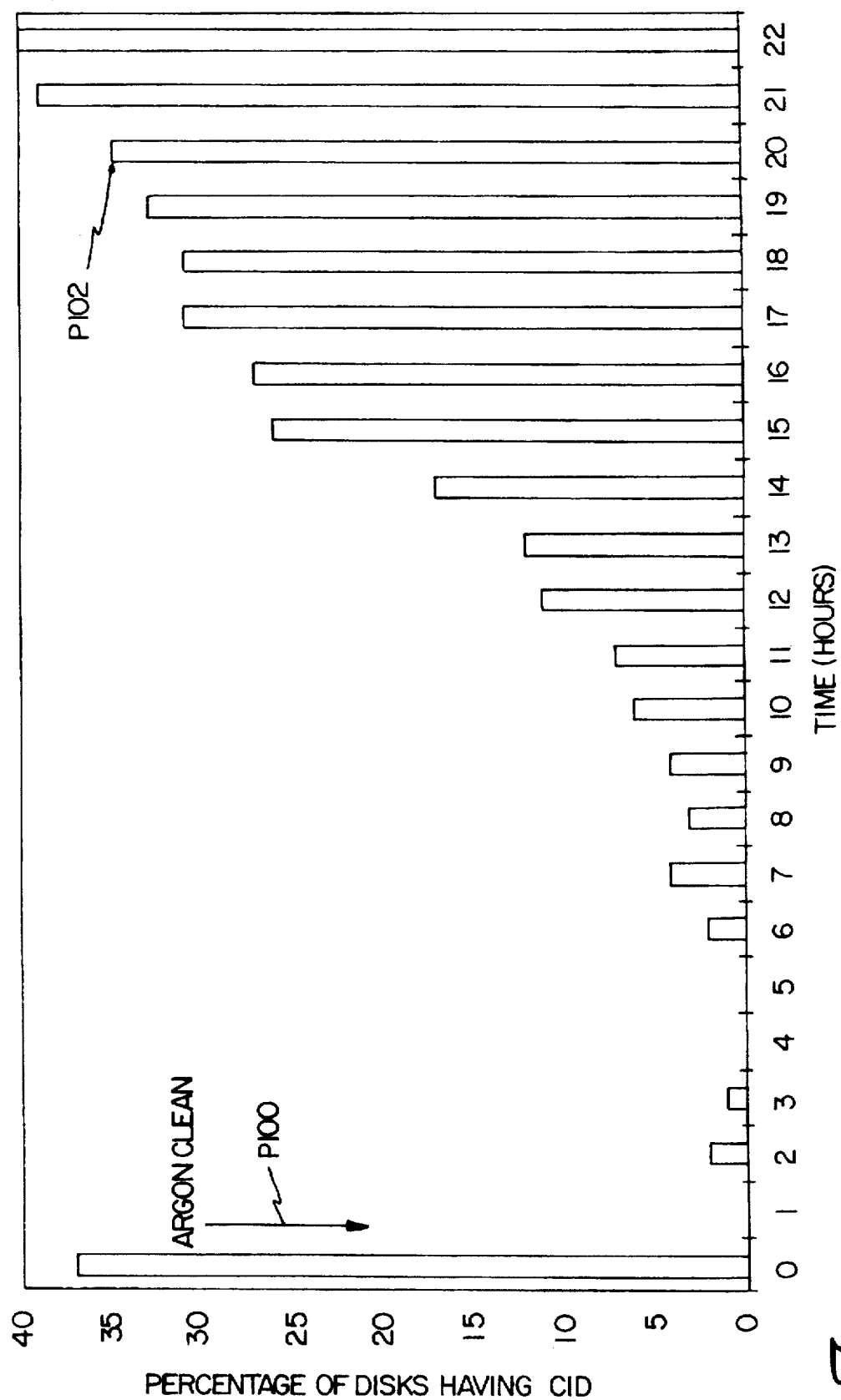
FIG. 1 is a prior art graph.

It has been determined that the above-described process significantly increases arcing free time (arcing is precursory to CID's). For example, for the dual phase process described in FIG. 5 using hydrogenated amorphous carbon, arcing free time is about 80 hours after cleaning. This is a significant improvement over the prior art, as indicated by FIG. 1, and thus provides a significantly more efficient manufacturing process. Additionally, the discs 12 created with such a process are typically of a better quality than the prior art because the frequency of CID's is reduced to almost negligible. Discs 12 also demonstrate tribological performance improvement over discs of the prior art.

Figure 7:
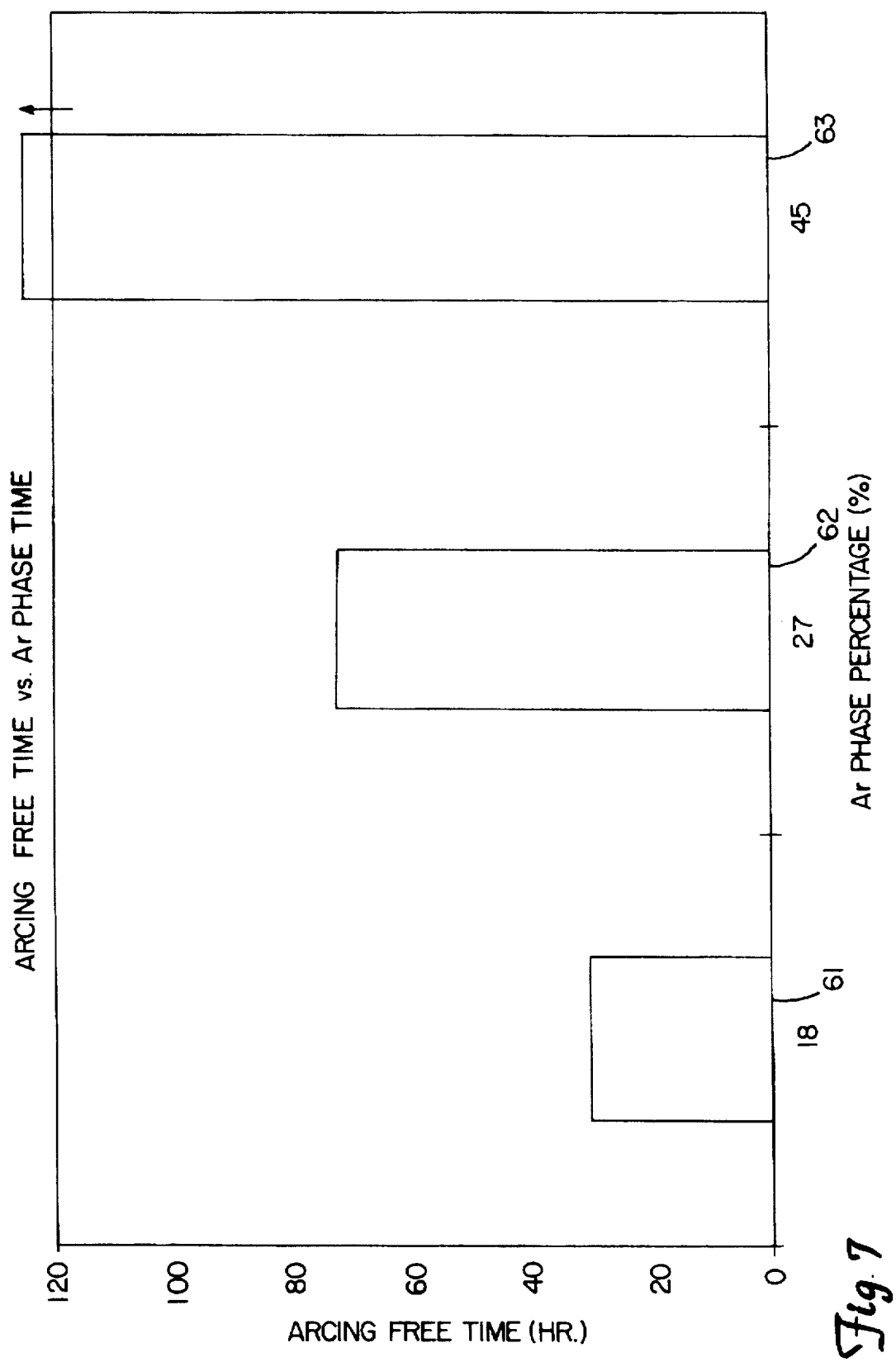
FIG. 7 is a bar graph depicting arcing free time as a function of argon phase time percentage.

Moreover, it has been determined that arcing free time increases when the argon phase T10 deposition time percentage increases with respect to total carbon process time T14. FIG. 7 shows a graph of arcing free time as a function of argon phase T10 deposition time for a single carbon process chamber system 50 and using hydrogenated amorphous carbon. Arcing free time increases from 30 hours to 72 hours when the argon phase T10 deposition time increases from 18 percent (G1) to 27 percent (G2) of the total carbon process time T14 in a single carbon chamber system. When the argon phase deposition time increases to 45 percent (G3), the arcing free time increases to longer than five days.

Figure 8:
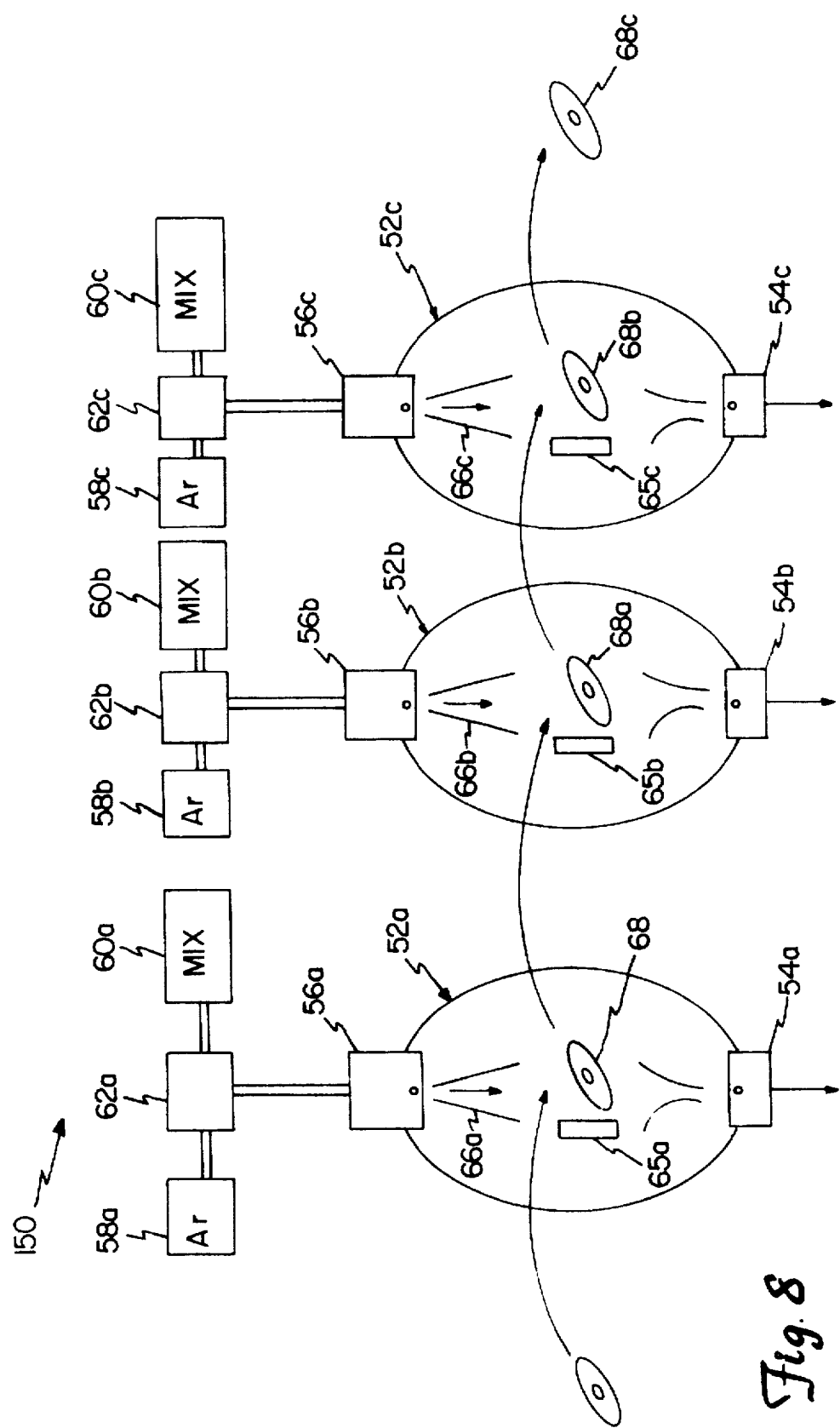
FIG. 8 is a schematic diagram of another apparatus for effecting a process embodying features of the present invention.

In another preferred embodiment, a disc is provided with a multiple layer dual phase carbon overcoat. The process used to create such multiple layer dual phase carbon overcoat includes subjecting a disc without an overcoat to a series of dual phase deposition processes. An apparatus suitable for performing such a process is an Intevac MDP250, manufactured by the Intevac Company of Santa Clara, Calif., as shown schematically in FIG. 8 and indicated generally at 150. Apparatus 150 includes a plurality of process chambers 52a, 52b, 52c, exhaust pumps 54a, 54b, 54c and gas outlets 56a, 56b, 56c. Gas outlets 56a, 56b, 56c are connected to sources of argon gas 58a, 58b, 58c, sources of gas consisting of an argon mixture 60a, 60b, 60c (such as argon and hydrogen, argon and nitrogen, or the like), and control means 62a, 62b, 62c, respectively. In one embodiment, mixture 60a, 60b, 60c includes about 85 percent argon and 15 percent hydrogen. Control means 62a, 62b, 62c are used to select whether argon gas 58a, 58b, 58c, or the argon mixture 60a, 60b, 60c is sent through outlets 56a, 56b, 56c and into the process chambers 52a, 52b, 52c, respectively. Carbon targets 65a, 65b, 65c are positioned within the process chambers 52a, 52b, 52c and within flowing gas 66a, 66b, 66c emanating from outlets 56a, 56b, 56c, respectively. Thus, as described above, ions bombard the carbon targets 65a, 65b, 65c. Of course, each chamber 52a, 52b, 52c can include two targets 65a, 65b, 65c (not shown). A disc 68 including substrate 38, chromium layer 39, and magnetic layer 40 suitable for deposition of an overcoat layer thereon is subjected serially to the sputtering processes (including reactive sputtering) as described above in each process chamber 62a, 62b, 62c as it is moved along an assembly line, or the like. Through sputtering, an amorphous carbon film is deposited on the respective disc. Thereafter, through sputtering a doped amorphous carbon film is deposited on the respective disc. Disc 68a includes a dual phase overcoat. Disc 68b includes a four layer dual phase overcoat. Disc 68c includes a six layer dual phase overcoat. It is contemplated that a disc having multiple layers thereon may include both hydrogenated amorphous carbon film and nitrogenated amorphous carbon film thereon. (Excess substance is exhausted through exhaust pumps 54a, b, c.)

In other words, the disc 68 is placed within each process chamber 52a, 52b, 52c and proximate to the carbon targets 65a, 65b, 65c which are bombarded first with argon ions exclusively for a period of time, or during an argon phase (indicated at T10 of FIG. 5), and then exclusively by hydrogenated argon ions, nitrogenated argon ions, or the like for a period of time, during a reactive argon (hydrogenated argon or nitrogenated argon) phase (indicated at T12 of FIG. 5). In one embodiment, each argon phase T10 is approximately two seconds and each reactive argon phase T12 is approximately four seconds. It is to be understood that subjecting the disc 68 to three dual phase overcoat film depositions is not critical, and any number of dual phase overcoat depositions may be employed in the process of fabricating a disc.

Figure 9:
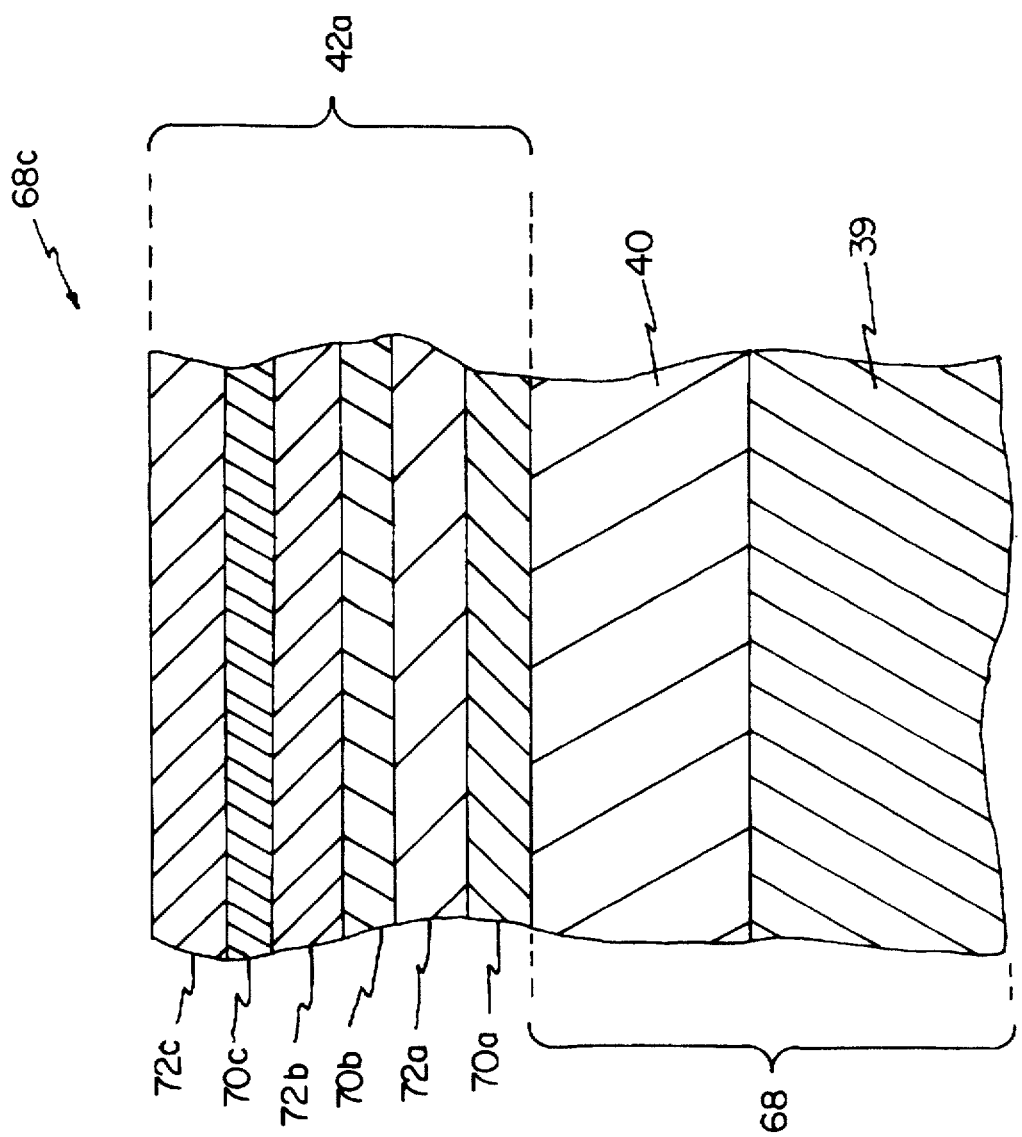
FIG. 9 is another cross-sectional schematic view of a portion of a rigid magnetic disc of a magnetic disc drive embodying features of the present invention.

FIG. 9 shows a cross-section view of disc 68c, which can be substituted in disc drive 10 for disc 12, having a multiple layer dual phase carbon overcoat 42a created by subjecting the disc to the multiple dual phase process described above and shown in FIG. 8. The process described above creates six layers of carbon overcoats, three layers of amorphous carbon film 70a, 70b, 70c and three layers of doped amorphous carbon film 72a, 72b, 72c. The amorphous carbon films 70a, 70b, 70c are each approximately 20 angstroms thick. The doped amorphous carbon films 72a, 72b, 72c are each approximately 50 angstroms thick, such that the total thickness of the overcoat 42a is about 200 angstroms.

The six layer-dual phase overcoat is significantly more hard than the prior art, and thus is better suited to resist scratches or other damage. Overcoat film hardness was tested for a prior art disc and a disc having the six layer-dual phase overcoat 42a (with hydrogenated amorphous carbon films) thereon with an EDC abrasion tester having five micrometers of SiC tape, two pound load and five minute abrasion time, which is a known carbon film hardness tester and configuration. Both overcoats were provided with the same hydrogen content in the hydrogenated amorphous carbon films. The number of scratches on the overcoat, which indicates the hardness of the tested surface, were counted with an optical microscope. The overcoat of the prior art contained an average of twelve scratches per surface. However, the six layer-dual phase overcoat having hydrogenated amorphous carbon film was significantly more hard and contained only about five scratches per surface.

The wear index and stiction of the disc having the dual phase overcoat, the disc having a multiple layer dual phase overcoat wherein the argon phase was 40 percent and having hydrogenated amorphous carbon films, and a prior art disc having only a hydrogenated amorphous carbon film were determined using a Contact Start Stop test (CSS) which is well known in the art. Each disc was subjected to 5,000 Start-Stop cycles and stiction was measured at 30 minutes of dwell.

For the prior art disc, the wear index was measured at 1.49 and stiction was determined to be 6 grams.

For the disc having the dual phase overcoat wherein the argon phase was at 18 percent, the wear index was 2.17, and stiction was 5.8 grams. For the dual phase overcoat disc wherein the argon phase was at 45 percent, the wear index was 1.88 and the stiction was measured at 4.8 grams. As determined from the above, although the wear index does not show a remarkable difference between the dual phase overcoat disc and the prior art disc, stiction was improved by 1.2 grams.

For the disc having the multiple layer dual-phase overcoat, the average wear index was 1.857 with a standard deviation of 0.32; and average stiction was measured to be 2.17 grams with a standard deviation of 0.916 grams. Thus, the multiple layer dual phase disc shows a significant improvement in stiction, of about 3.8 grams, over the prior art.

Additionally, the disc having the multiple layer dual phase overcoat is superior to that of the prior art in terms of corrosion resistance. Corrosion resistance was tested on a disc having a multiple layer dual phase overcoat (wherein the doped amorphous carbon films were hydrogenated amorphous carbon films) and a prior art disc having a hydrogenated amorphous carbon overcoat. To perform this test, three discs were put in an Environment Chamber for five days, where temperature and relative humidity were 60° C. and 80 percent, respectively. Another three control discs from the same group were put in the normal atmosphere for the same period. The particle numbers of specific elements, normally transit metals, were measured on both the discs in the Environment Chamber and the discs exposed to normal atmosphere. The difference in the number between these groups, indicates corrosion of the disc. It was determined that the cobalt particle count difference between the Environment Chamber and normal atmosphere is about 2.5 parts per billion for the discs with the multiple layer dual phase overcoat. The cobalt particle count difference between the Environment Chamber and normal atmosphere is about 16 parts per billion for the prior art discs with the hydrogenated amorphous carbon overcoat. Thus, discs of the present invention improve corrosion resistance over the prior art by over 80 percent.

Details of the test results are shown below in Table 1 wherein "E.C." represents data for the discs in the Environment Chamber and "control" represents discs in the normal atmosphere.

TABLE 1

|  | DUAL PHASE CARBON | | PRIOR ART | |
|---|---|---|---|---|
|  | E.C. | CONTROL | E.C. | CONTROL |
| MEAN (ppb) | 4.258 | 1.82 | 19.422 | 4.021 |
| STD. DEV. (ppb) | 0.555 | 0.4 | 2.655 | 0.73 |

As is clearly demonstrated by the above test results, both the discs and the process of the present invention are superior to that of the prior art.

Although the present invention has been described with reference to preferred embodiments, workers skilled in the art will recognize that changes may be made in form and detail without departing from the spirit and scope of the invention.

What is claimed is:

1. A method of manufacturing a magnetic disc for use in a magnetic disc drive, comprising:

providing a partially manufactured magnetic disc having a magnetic layer thereon;

sputtering an amorphous carbon film on the magnetic layer; and sputtering a doped amorphous carbon film on the amorphous carbon film.

2. The method of claim 1 wherein the amorphous carbon film is sputtered for a first period of time, the doped amorphous carbon film is sputtered for a second period of time, and wherein the second period of time is greater than the first period of time.

3. The method of claim 1 wherein the step of sputtering a doped amorphous carbon film includes the step of providing an argon and hydrogen gas mixture having a hydrogen content of about eight percent.

4. The method of claim 1 wherein the doped amorphous carbon film is one of hydrogenated amorphous carbon film and nitrogenated amorphous carbon film.

5. The method of claim 1 wherein the doped amorphous carbon film is hydrogenated amorphous carbon film.

6. The method of claim 5 wherein:

the step of sputtering an amorphous carbon film is performed during an argon phase sputtering time;

the step of sputtering the hydrogenated amorphous carbon film is performed during a reactive argon phase sputtering time;

a dual phase sputtering time consists of the argon phase sputtering time plus the reactive argon phase sputtering time; and the argon phase sputtering time as a fraction of the dual phase sputtering time is between about 18 percent and about 45 percent.

7. The method of claim 6 wherein the argon phase sputtering time as a fraction of the dual phase sputtering time is one of about 18 percent, about 27 percent, and about 45 percent.

8. The method of claim 5 and further comprising:

sputtering two layers of both amorphous carbon film and hydrogenated amorphous carbon film on the magnetic disc.

9. The method of claim 1 and further comprising:

sputtering two layers of both amorphous carbon film and doped amorphous carbon film on the magnetic disc.

10. A method of manufacturing a magnetic disc for use in a magnetic disc drive, comprising:

providing a partially manufactured magnetic disc; and sputtering alternating layers of amorphous carbon film and doped amorphous carbon film on the partially manufactured magnetic disc.

11. The method of claim 10 wherein the reactive carbon film is one of hydrogenated amorphous carbon film and nitrogenated amorphous carbon film.

12. A method of manufacturing a magnetic disc, comprising:

providing a sputtering apparatus having a first process chamber;

providing a partially manufactured magnetic disc having a magnetic layer thereon;

placing the partially manufactured magnetic disc within the first process chamber;

sputtering a first layer of amorphous carbon film on the magnetic layer; and sputtering a first layer of doped amorphous carbon film on the first layer of amorphous carbon film thereby creating a dual phase carbon overcoat on the magnetic disc.

13. The method of claim 12 wherein the step of sputtering a first layer of doped amorphous carbon film includes sputtering hydrogenated amorphous carbon film on the first layer of amorphous carbon film.

14. The method of claim 12 wherein the sputtering apparatus further includes a second process chamber, the method further comprising:

placing the magnetic disc within the second process chamber;

sputtering a second layer of amorphous carbon film on the dual phase carbon overcoat; and sputtering a second layer of doped amorphous carbon film on the second layer of amorphous carbon film thereby creating a multiple layer dual phase carbon overcoat on the magnetic disc.

15. The method of claim 14 wherein the step of sputtering a second layer of doped amorphous carbon film includes sputtering hydrogenated amorphous carbon film on the second layer of amorphous carbon film.

16. The method of claim 14 wherein the sputtering apparatus further comprises a third process chamber, the method further comprising:

placing the magnetic disc within the third process chamber;

sputtering a third layer of amorphous carbon film on the multiple layer dual phase carbon overcoat; and sputtering a third layer of doped amorphous carbon film on the third layer of amorphous carbon film.

17. The method of claim 16 wherein the step of sputtering a third layer of doped amorphous carbon film includes sputtering hydrogenated amorphous carbon film on the third layer of amorphous carbon film.

\* \* \* \* \*

UNITED STATES PATENT AND TRADEMARK OFFICE
CERTIFICATE OF CORRECTION

PATENT NO. : 5,785,825
DATED : July 28, 1998
INVENTOR(S) : Kuo-Hsing Hwang et al.

It is certified that error appears in the above-identified patent and that said Letters Patent is hereby corrected as shown below: On the title page:

Under [56] References Cited please insert

FOREIGN PATENT DOCUMENTS

| | | |
|---|---|---|
| 0 248 556 | 12/1987 | Europe |
| 0 643 385 A2 | 3/1995 | Europe |
| 93-113743 | 5/1993 | Japan (Abstract only) |

Signed and Sealed this

Fifth Day of January, 1999

Attest:

Attesting Officer

*Acting Commissioner of Patents and Trademarks*

UNITED STATES PATENT AND TRADEMARK OFFICE
CERTIFICATE OF CORRECTION

PATENT NO. : 5,785,825
DATED : July 28, 1998
INVENTOR(S) : Kuo-Hsing Hwang et al.

It is certified that error appears in the above-indentified patent and that said Letters Patent is hereby corrected as shown below:

On the title page,
Under [75] Inventors:

Change "Quy Cuu Nguyen, Milbidas" to --Quy Cuu Nguyen, Milpitas--

Signed and Sealed this

Second Day of February, 1999

Attest:

Attesting Officer

*Acting Commissioner of Patents and Trademarks*